US007718215B2

(12) United States Patent
Byun et al.

(10) Patent No.: US 7,718,215 B2
(45) Date of Patent: May 18, 2010

(54) APPARATUS FOR FORMING ALIGNMENT LAYER AND AUTO-CALIBRATION METHOD THEREOF

(75) Inventors: Young-Sang Byun, Gyeongsangbuk-do (KR); Joung-Won Choi, Busan (KR); Hong-Seok Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 129 days.

(21) Appl. No.: 11/984,627

(22) Filed: Nov. 20, 2007

(65) Prior Publication Data

US 2008/0118653 A1 May 22, 2008

Related U.S. Application Data

(62) Division of application No. 10/846,654, filed on May 17, 2004, now Pat. No. 7,338,560.

(30) Foreign Application Priority Data

Dec. 11, 2003 (KR) ..................... 10-2003-0090354

(51) Int. Cl.
*C23C 16/52* (2006.01)

(52) U.S. Cl. .......................................... 427/8; 427/162

(58) Field of Classification Search ..................... 427/8, 427/162, 421.1; 347/19
See application file for complete search history.

(56) References Cited

U.S. PATENT DOCUMENTS

| | | | | |
|---|---|---|---|---|
| 5,477,245 | A | 12/1995 | Fuse | |
| 6,036,297 | A | 3/2000 | Hayasaki | |
| 6,145,981 | A | 11/2000 | Akahira et al. | |
| 6,244,702 | B1 | 6/2001 | Sakino et al. | |
| 6,660,332 | B2 | 12/2003 | Kawase et al. | |
| 2002/0044163 | A1 | 4/2002 | Shigemura | |
| 2002/0063747 | A1 | 5/2002 | Van Der Meijs et al. | |
| 2003/0007033 | A1 * | 1/2003 | Ito et al. | 347/40 |
| 2003/0190419 | A1 | 10/2003 | Katagami et al. | |
| 2004/0257399 | A1 | 12/2004 | Iwata | |

FOREIGN PATENT DOCUMENTS

| | | | |
|---|---|---|---|
| JP | 05254121 A | | 10/1993 |
| JP | 11-64626 | | 3/1999 |
| JP | 2001-042330 | * | 2/2001 |

* cited by examiner

*Primary Examiner*—Timothy H Meeks
*Assistant Examiner*—Elizabeth Burkhart
(74) *Attorney, Agent, or Firm*—Morgan Lewis & Bockius LLP

(57) ABSTRACT

An apparatus for forming alignment layer includes a printing stage for supporting a substrate thereon, at least one inkjet head having at least one spray hole above the printing stage, the spray hole spraying an alignment material onto the substrate, a head support supporting the inkjet head, a pitch measuring unit adjacent to the inkjet head, and a display unit displaying measured results provided by the pitch measuring unit.

9 Claims, 4 Drawing Sheets

APPARATUS FOR FORMING ALIGNMENT LAYER AND AUTO-CALIBRATION METHOD THEREOF

This is a divisional application of application Ser. No. 10/846,654, filed on May 17, 2004, now U.S. Pat. No. 7,338,560, which is hereby incorporated by reference.

The present invention claims the benefit of Korean Patent Application No. 2003-90354 filed in Korea on Dec. 11, 2003, which is hereby incorporated by reference.

BACKGROUND OF THE INVENTION

1. Field of the Invention

The present invention relates to an apparatus and method for fabricating a liquid crystal display device, and more particularly, to an apparatus for forming an alignment layer and an auto-calibration method thereof for a liquid crystal display device.

2. Discussion of the Related Art

In general, a liquid crystal display device uses optical anisotropy and polarization properties of liquid crystal molecules to produce an image. For instance, the orientation of the liquid crystal molecules can be aligned in a specific direction controlled by an applied electric field. As the applied electric field changes, so does the alignment of the liquid crystal molecules. Due to the optical anisotropy of the liquid crystal, the refraction of incident light on the liquid crystal molecules also changes depending on the alignment direction of the liquid crystal molecules. Thus, by properly controlling an electric field applied to a group of liquid crystal molecules in respective pixels of a liquid crystal display device, a desired image can be produced by diffracting light.

The liquid crystal display device generally includes a first substrate, a second substrate and a liquid crystal layer interposed between the first and second substrates. A spacer is also interposed between the first and substrates to maintain a predetermined space between the substrates, and a sealant is used to bond the substrates to each other at the edges of the substrates.

In general, a method for fabricating a liquid crystal display device includes coating an alignment layer on a substrate, rubbing the alignment layer and then forming a spacer on the substrate. Further, a sealant is printed at edges of the substrate with an opening as a liquid crystal injection opening. After aligning the substrate with a second substrate, the substrates are sealed by the sealant with a predetermined space therebetween. Then, liquid crystal is injected into the predetermined space between the substrates through the opening, thereby forming a liquid crystal cell.

Typical methods of coating an alignment layer include screen-printing method, photolithography method, and inkjet-printing method. Although the screen-printing method is a relatively simple and low-cost method, it is not suitable for making a high-density model, because alignment layer formed by the screen-printing method has poor uniformity of depth and width. In comparison, the photolithography method produces alignment layers with good uniformity, but the photolithography method is a more complicated method using expensive apparatus and suffers frequent damages, thereby increasing material cost. Further in comparison, the inkjet-printing method has been the subject of recent research and development because of its wide applications and low-cost.

FIG. 1 is a schematic view of an inkjet type apparatus for coating an alignment layer according to the related art. In FIG. 1, a tilt controllable inkjet head 3 supported by a head support 4 is placed above the horizontal printing stage 2 on which a substrate 1 is disposed. The substrate 1 on the printing stage 2 can be fixed or movable and the number of the inkjet head 3 can be determined based on size of the printing stage 2. The inkjet head 3 sprays an alignment material onto the substrate 1 via a spray hole (not shown), while the head support 4 and the printing stage 2 are moved by a loading means, such as a rail. For example, the head support 4 and the printing stage 2 are moved in a manner such that rows of the alignment material are sprayed sequentially onto the substrate 1 via the spray hole, thereby forming an alignment layer on the substrate 1.

FIG. 2 is a cross-sectional view of an apparatus for measuring a pitch between ink according to the related art. In FIG. 2, after an alignment material is formed on a substrate, the substrate is moved into an apparatus 20 for measuring a pitch between the alignment material. Because such a pitch determines the quality of the alignment layer and the substrate, a substrate having a unsatisfactory pitch can be detected and discarded as a test substrate. In particular, the measuring apparatus 20 includes a microscope 21 for measuring a distance D between the rows of the alignment material formed on the substrate, thereby detecting any abnormal pitch of the alignment material based on the measured distance. However, such a measurement by another apparatus increases production time, reduces efficiency and requires larger work space, even though the pitch of the inkjet head 3 shown in FIG. 1 and its spray hole affect the pitch of the alignment material.

SUMMARY OF THE INVENTION

Accordingly, the present invention is directed to an apparatus for forming alignment layer and an auto-calibration method thereof that substantially obviates one or more of the problems due to limitation and disadvantages of the related art.

An object of the present invention is to provide an apparatus for coating an alignment layer having auto-calibration means.

Another object of the present invention is to provide a method of auto-calibration using the apparatus for forming an alignment layer, which does not need any additional pitch measuring process, because coating of alignment on the substrate and pitch measuring between ink-jet heads is performed in the same process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantage and in accordance with the purpose of the present invention, as embodied and broadly described, the apparatus for forming alignment layer includes a printing stage for supporting a substrate thereon, at least one inkjet head having at least one spray hole above the printing stage, the spray hole spraying an alignment material onto the substrate, a head support supporting the inkjet head, a pitch measuring unit adjacent to the inkjet head, and a display unit displaying measured results provided by the pitch measuring unit.

In another aspect, a method of auto-calibration using the apparatus for forming alignment layer includes: coating alignment material on a substrate by an inkjet head; measuring pitch by a pitch measuring unit; displaying the measured pitch in the pitch display unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
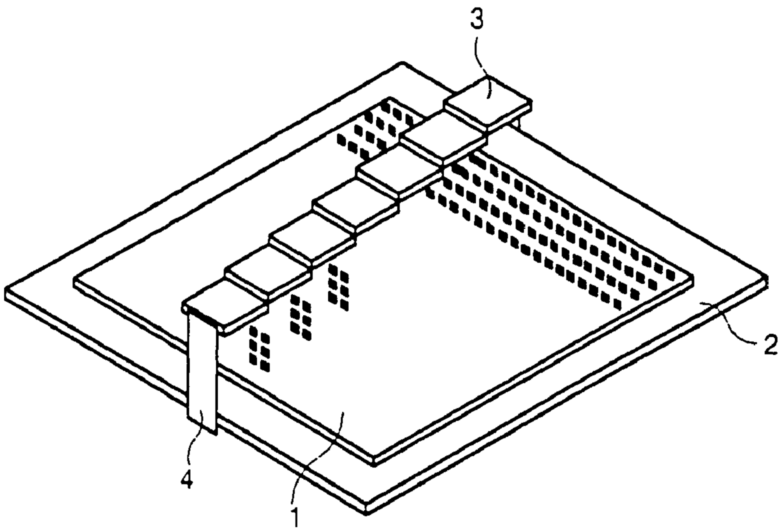
FIG. 1 Related Art
FIG. 1 is a schematic view of an inkjet type apparatus for coating an alignment layer according to the related art.
Figure 2:
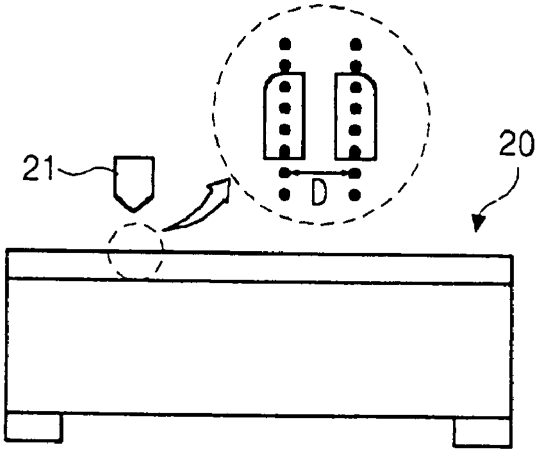
FIG. 2 Related Art
FIG. 2 is a cross-sectional view of an apparatus for measuring a pitch between ink according to the related art.
Figure 3:
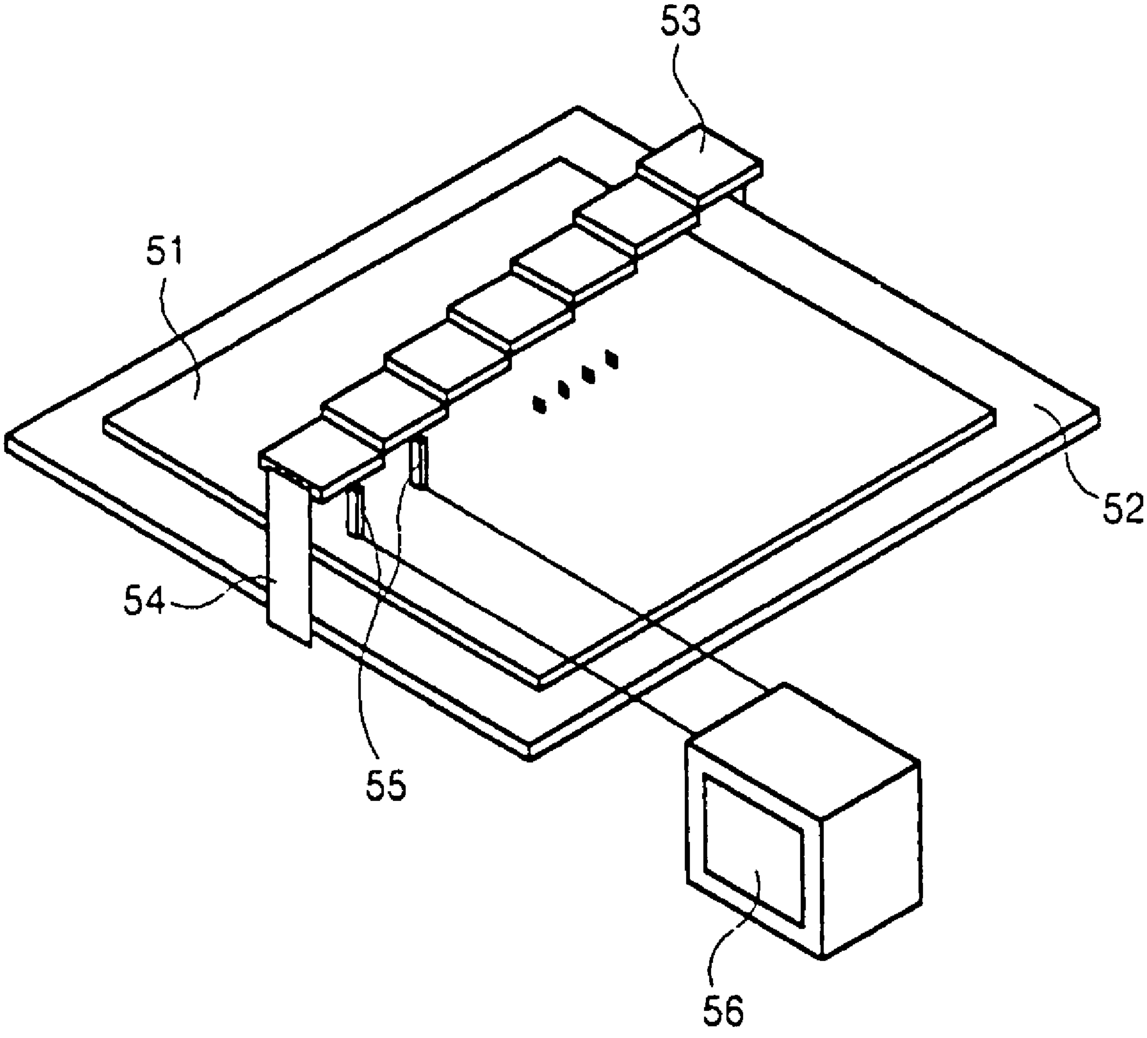
FIG. 3 is a schematic view of an apparatus for coating and measuring an alignment layer according to an embodiment.

FIG. 3 is a schematic view of an apparatus for coating and measuring an alignment layer according to an embodiment. In FIG. 3, an alignment-layer coating and measuring apparatus may include a printing stage 52 and inkjet heads 53 having spray holes (not shown) placed above the printing stage 52 by a head support 54. The head support 54 may also control a spray angle of the inkjet heads 53. The apparatus may also include a pitch measuring unit 55 placed adjacent to the inkjet heads 53 and a display unit 56 connected to the pitch measuring unit 55 for displaying measured pitch results. In addition, a substrate 51 may be disposed on the printing stage 52. An alignment material may be loaded in the inkjet heads 53 or the head support 54 to be sprayed from the inkjet heads 53 via the spray holes to form an alignment layer on the substrate 51 while the pitch measuring unit 55 measures a pitch of the inkjet heads 53.

At least one of the head support 54 and the printing stage 52 may be movable by an automated loading means, such as a rail. Accordingly, the head support 54 or the printing stage 52 may move along a vertical direction as rows of alignment material being coated on the substrate 51. Further, a plurality of inkjet heads 53 may be joined with the head support 54, thereby increasing printing efficiency. The number of the plurality of inkjet heads 53 may be determined based on a size of the substrate 51 and any other needs.

Figure 4:
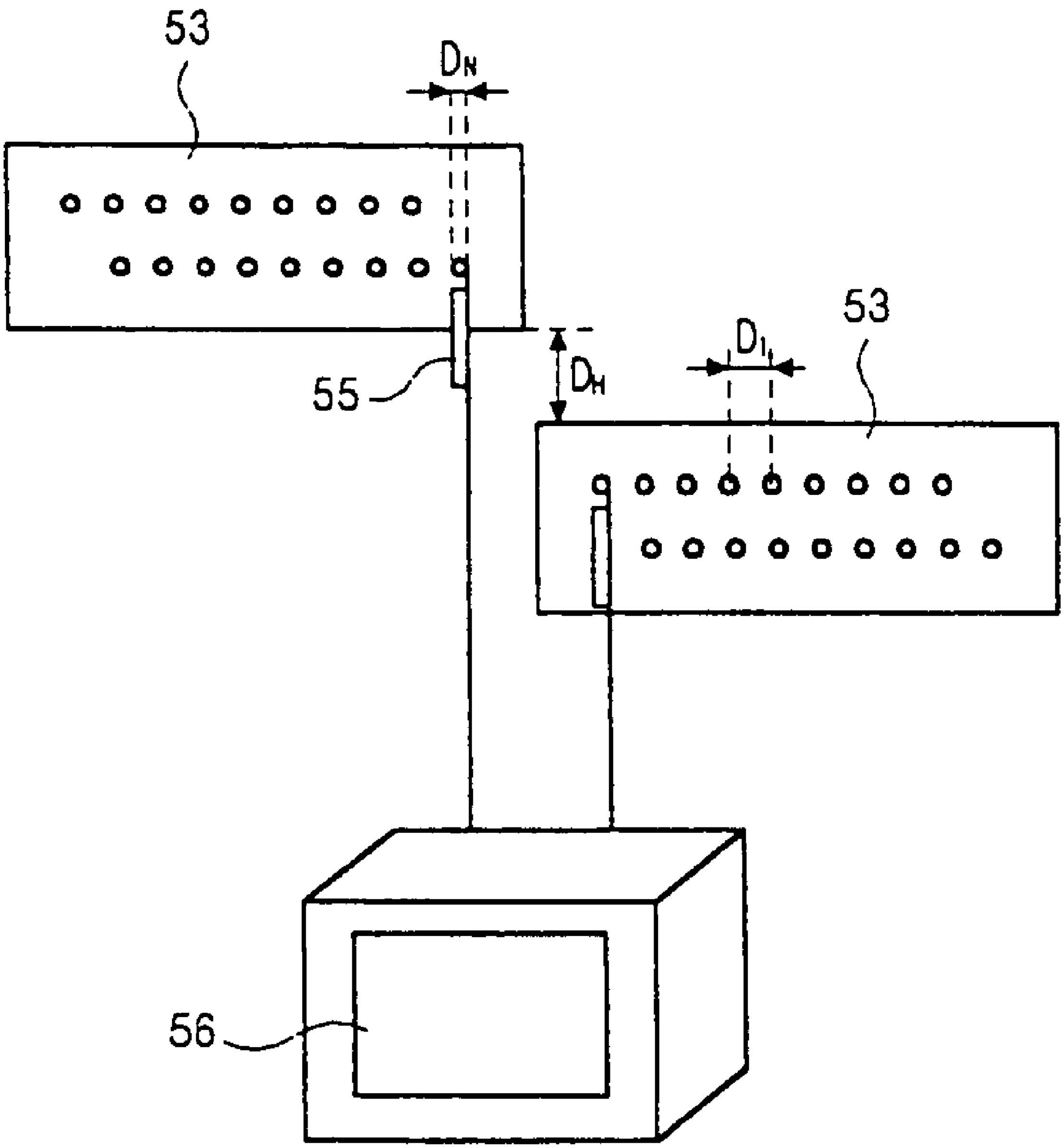
FIG. 4 is a view of the pitch measuring unit of FIG. 3.

FIG. 4 is a view of the pitch measuring unit of FIG. 3. In FIG. 4, the pitch measuring unit 55 may include a sensor, such as a bar-type sensor. In particular, the pitch measuring unit 55 may measure one of a pitch $D_H$ between the inkjet heads 53, a pitch $D_1$ between spray holes of the inkjet heads 53, and a size $D_N$ of the spray holes of the inkjet heads 53. A user may set up the pitch measuring unit 55 to provide one, some or all of such measurements.

The pitch measuring unit 55 may be connected to the display unit 56 by a cable or a wireless connection such that measured results provided by the pitch measuring unit 55 may be transmitted to the display unit 56. The display unit 56 may include a monitor as an output means for displaying the measured results to a user.

Accordingly, the apparatus for coating and measuring an alignment layer according to the embodiment measures a distance between the inkjet heads, a pitch of between the spray holes of the inkjet heads, and a size of the spray holes of the inkjet heads as the alignment material being coated on a substrate. An amount of test substrates is reduced, thereby reducing production time and cost.

Figure 5:
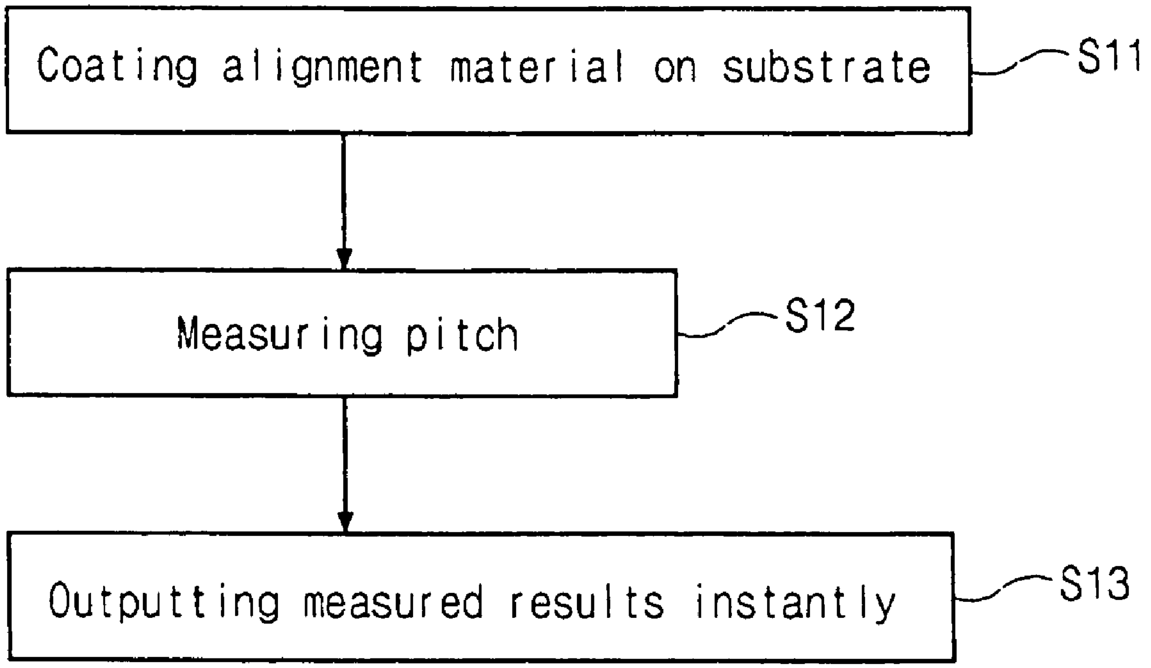
FIG. 5 is a flowing chart of an auto-calibration method using the apparatus of FIG. 3 according to an embodiment.

FIG. 5 is a flowing chart of an auto-calibration method using the apparatus of FIG. 3. In FIG. 5, in step S11, an alignment material may be coated on a substrate disposed on the printing stage 52 using the inkjet heads 53 shown in FIG. 3. The alignment material may be loaded in the inkjet heads 53 or the head support 54, such that the coating is consecutively loaded.

In step S12, one of a pitch between the inkjet heads 53, a pitch between the spray holes of the inkjet heads 53 or a size of the spray holes of the inkjet heads 53 may be measured continuously by the pitch measuring unit 55 shown in FIG. 3. Alternatively, the pitch measuring unit 55 may repeatedly measure such a pitch at a predetermined time interval. Types of the measurements provided by the pitch measuring unit 55 may be determined by a user.

In step S13, the measurements regarding the pitch data of coated inks/alignment material provided by the pitch measuring unit 55 may be transmitted to the display unit 56 and outputted almost instantaneously on, for example, a monitor.

Accordingly, the apparatus for forming alignment layer and the auto-calibration method thereof according to the embodiment provides an early detection of error in alignment printing, and prevents forming alignment with a poor quality, thereby minimizing substrate damage and reducing process time and cost.

It will be apparent to those skilled in the art that various modifications and variations can be made in the apparatus for forming alignment layer and auto-calibration method using the apparatus without departing from the spirit or scope of the invention. Thus, it is intended that the present invention covers the modifications and variations of this invention provided they come within the scope of the appended claims and their equivalents.

What is claimed is:

1. A method of auto-calibration of an apparatus for forming alignment layer, comprising:

coating an alignment material on a substrate using an inkjet head;

measuring a pitch of the inkjet head using a pitch measuring unit; and displaying the measured pitch on a pitch display unit, wherein the alignment material is coated while the pitch measuring unit measures the pitch of the inkjet head.

2. The method according to claim 1, wherein the measuring includes measuring a size of a spray hole of the inkjet head.

3. The method according to claim 1, wherein the coating the alignment material includes spraying the alignment material via one or more spray holes of the inkjet head.

4. The method according to claim 3, wherein the measuring includes measuring a pitch between the one or more spray holes of the inkjet head.

5. The method according to claim 1, wherein the coating the alignment material includes spraying the alignment material using a second inkjet head.

6. The method according to claim 5, wherein the measuring includes measuring a pitch between the inkjet heads.

7. The method according to claim 1, wherein the coating and the measuring are performed substantially simultaneously.

8. The method according to claim 1, wherein the coating, the measuring and the displaying are performed substantially simultaneously.

9. The method according to claim 1, wherein the measuring is performed continuously as the alignment material being coated.

* * * * *